US006580352B1

(12) United States Patent
Pino et al.

(10) Patent No.: US 6,580,352 B1

(45) Date of Patent: Jun. 17, 2003

(54) MANUAL CONTROL APPARATUS AND METHOD

(75) Inventors: Tomas J. Pino, Lake Worth, FL (US); Daniel U. Johnston, Nokomis, FL (US)

(73) Assignee: Aptek William, Inc., Sarasota, FL (US)

( * ) Notice: Subject to any disclaimer, the term of this patent is extended or adjusted under 35 U.S.C. 154(b) by 0 days.

(21) Appl. No.: 09/443,956

(22) Filed: Nov. 19, 1999

(51) Int. Cl.[7] ................................................ H01L 10/32

(52) U.S. Cl. ....................... 338/162; 338/138; 338/153; 338/167; 338/170

(58) Field of Search ................................ 338/153, 162, 338/138, 167, 170

(56) References Cited

U.S. PATENT DOCUMENTS

| | | | |
|---|---|---|---|
| 4,430,634 | A | 2/1984 | Hufford et al. |
| 4,621,250 | A | 11/1986 | Echasseriau et al. |
| 4,812,803 | A | 3/1989 | Hochholzer |
| 4,944,269 | A | 7/1990 | Imoehl |
| 4,958,607 | A | 9/1990 | Lundberg |
| 5,016,586 | A | 5/1991 | Imamura et al. |
| 5,133,321 | A | 7/1992 | Hering et al. |
| RE34,302 | E | 7/1993 | Imoehl |
| 5,233,882 | A | 8/1993 | Byram et al. |
| 5,241,936 | A | 9/1993 | Byler et al. |
| RE34,574 | E | 4/1994 | Imoehl |
| 5,385,068 | A | 1/1995 | White et al. |
| 5,408,899 | A | 4/1995 | Stewart |
| 5,415,144 | A | 5/1995 | Hardin et al. |
| 5,416,295 | A | 5/1995 | White et al. |
| 5,509,396 | A | 4/1996 | Tamaki |
| 5,529,296 | A | 6/1996 | Kato et al. |
| 5,661,890 | A | 9/1997 | Pfaffenberger |
| 5,697,260 | A | 12/1997 | Rixon et al. |
| 5,768,946 | A | 6/1998 | Fromer et al. |
| 5,773,820 | A | 6/1998 | Osajda et al. |
| 5,812,050 | A | 9/1998 | Figgins |
| 5,868,050 | A | 2/1999 | Papenhagen et al. |
| 5,886,490 | A | 3/1999 | Miller et al. |
| 5,934,152 | A | 8/1999 | Aschoff et al. |
| 5,937,707 | A | 8/1999 | Rixon et al. |
| 5,964,125 | A | 10/1999 | Rixon et al. |

FOREIGN PATENT DOCUMENTS

| | | |
|---|---|---|
| DE | 197 20 390 | 11/1998 |
| EP | 0 963 871 A2 | 12/1999 |

OTHER PUBLICATIONS

International Search Report dated Aug. 2, 2001, for corresponding international application PCT/US00/42191.

*Primary Examiner*—Karl D. Easthom

(74) *Attorney, Agent, or Firm*—Brinks Hofer Gilson & Lione

(57) ABSTRACT

The invention relates to a manual control apparatus, such as a control pedal for a drive-by-wire control systems, and similar applications. According to an aspect of the invention, the manual control apparatus comprises a hysteresis mechanism that provides more precise and controllable hysteresis than previous mechanism. According to a further aspect of the invention, the manual control apparatus comprises an angular position sensor, and the angular position sensor may comprise abutments that reduce variation in the sensor. According to a still further aspect of the invention, the manual control apparatus comprises a stop pin that regulates the position of a rotatable member relative to the position sensor with less variation. The stop pin may also be used as a single fastener the holds the manual control apparatus together.

11 Claims, 8 Drawing Sheets

MANUAL CONTROL APPARATUS AND METHOD

BACKGROUND

The invention relates to a manual control apparatus, such as a control pedal for drive-by-wire control systems, and similar applications.

Manual control apparatuses, such as throttle control pedals for drive-by-wire throttle control systems, are known in the art. Due to the fact that such pedals eliminate the mechanical linkage to the carburetor on an engine, hysteresis is often added to replicate the "feel" of a pedal having a mechanical linkage. In particular, it is desirable for a rotatable member, for example a pedal, to generate an increased resistance during depression, and an ability stay at a fixed position with reduced force in order to avoid operator fatigue. This is typically provided by introducing a deliberate amount of frictional resistance to movement at one or more locations in the pedal mechanism. A similar effect may also be desirable in other manual control apparatuses such as a hand operated throttle, or a brake control pedal for a drive-by-wire control system, without limitation.

Although manual control apparatuses having hysteresis are known in the art, a desirable apparatus would have more precisely controlled hysteresis than is presently available. In addition, a desirable apparatus would also be light in weight, simple in manufacture, and simple in assembly with as few components as possible.

In addition to hysteresis, manual control apparatuses typically have a rotation sensor that indicates rotation of the rotatable member, for example a pedal, relative to a fixed point, such as a base to which the pedal is mounted. Precise registration of the rotatable member relative to the fixed point at a particular angle is important for both calibration, and for repeatability from apparatus to apparatus. In a throttle control pedal, the angle of rotation of the pedal is typically measured from the idle position. However, tolerance stack-up can cause a significant variation within a group of apparatuses. Tolerance stack-up and manufacturing variation may also cause significant variation within the rotation sensor. Therefore, a desirable apparatus would provide reduced variation in the rotation sensor system.

SUMMARY

According to an aspect of the invention, a spring biases a rotatable member relative to a base, and the body of the spring is forced against a friction element. The friction element rides upon a curved friction surface and is directly coupled to the rotatable member.

According to a further aspect of the invention, a manual control apparatus is provided having an angular position sensor with a housing and a pivot mounted to the housing. A rotatable member is coupled to the pivot and the angular position sensor indicates an angular position of the rotatable member. A stop pin is mounted on the housing and the rotatable member rests on the stop pin when in the idle position.

According to a still further aspect of the invention, a manual control apparatus is provided having an angular position sensor comprising a housing mounted to a base. The housing is coupled to a pivot to sense rotation thereof. The housing comprises a first abutment that defines a first datum plane perpendicular to an axis of rotation of the pivot, and a second abutment that defines a second datum plane perpendicular to the axis of rotation. A rotor within the housing is coupled to the pivot shaft, and a sensing element cooperates with the rotor to indicate an angular position thereof relative to the base. The sensing element rests upon the first abutment, and a rotor spring biases the rotor against the second abutment.

According to a still further aspect of the invention, a manual control apparatus is provided, comprising an angular position sensor comprising a housing coupled to a pivot to sense rotation thereof. The housing comprises a pair of opposing bosses that are received within recesses in a base. An idle stop is mounted to the housing and the base thereby retaining the bosses within the recesses. The housing is restrained within the base using the idle stop as a single fastener.

The manual control apparatus of the invention is particularly well suited for use with a drive-by-wire system wherein a direct mechanical linkage to an engine throttle or brake hydraulic system, for example, is eliminated.

DETAILED DESCRIPTION

Figure 1:
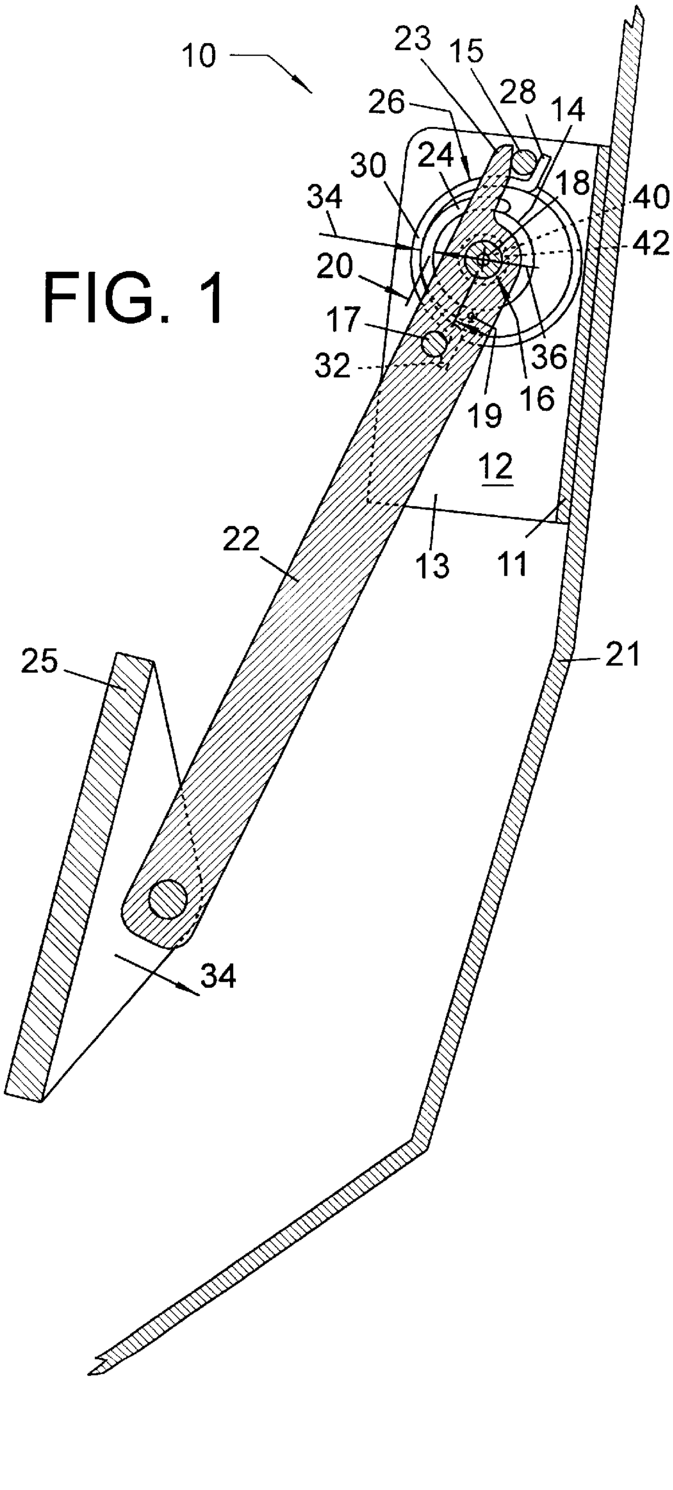
FIG. 1 presents a side cross-section view of a manual control apparatus according to an aspect of the invention, taken along line 1—1 of FIG. 2.
Figure 2:
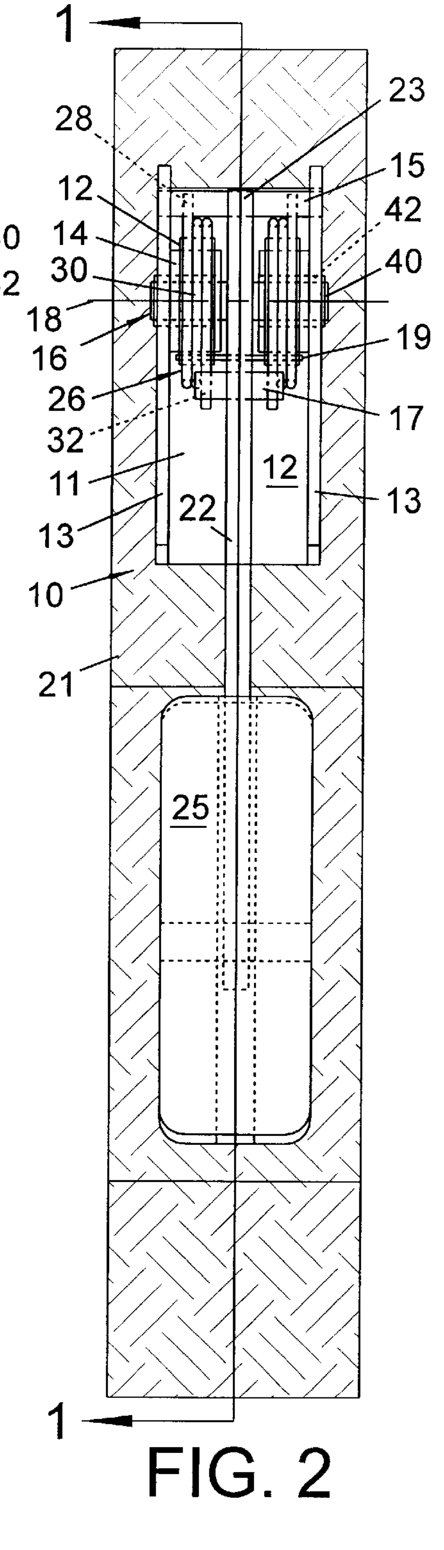
FIG. 2 is a front view of a manual control apparatus according to an aspect of the invention.

Various aspects of the invention are presented in FIGS. 1–18, which are not drawn to scale, and wherein like components in the numerous views are numbered alike. As used herein, the term "manual" refers to operation by hand, foot, or any other body part. Referring now specifically to FIGS. 1 and 2, a manual control apparatus 10 with hysteresis is presented according to one aspect of the invention, in this example a throttle control pedal. FIG. 2 is a front view of the pedal, and FIG. 1 is a cross-sectional side view taken along line 1—1 of FIG. 2. The throttle control pedal 10 is shown mounted to a suitable structure of a motorized vehicle, such as a passenger compartment firewall 21.

The throttle control pedal 10 comprises a base 12 having a curved friction surface 14. A pivot 16 is mounted to the base 12, which defines an axis of rotation 18 spaced from the curved friction surface 14, as indicated at 20. A rotatable member 22, in this example a lever, is mounted to the pivot 16, wherein the rotatable member 22 is rotatable around the axis of rotation 18 relative to the base 12. A friction element 24 is mounted to rotate with the rotatable member 22, spaced from the axis of rotation 18, and forcible against the curved friction surface 14.

The friction element 24 is directly coupled to the rotatable member 22. As used herein, the term "directly coupled" means that the friction element is mechanically linked (as opposed to frictional coupling alone) to the rotatable member for rotation therewith so that the two rotate in unison. This is in contrast to certain prior art hysteresis mechanisms that implement only frictional coupling with the spring to induce movement of the friction element. The present invention offers a distinct advantage in that the friction element is directly forced to move with the rotatable member 22 rather than relying solely upon the presence of sufficient frictional force at the spring/friction element interface to move the friction element.

The rotatable member is biased by a spring 26 having a first end 28, a second end 32, and an intermediate portion 30 between the first end 28 and the second end 32. The first end 28 is coupled to the base 12, and the second end 32 is coupled to the rotatable member 22. Rotation of the rotatable member 22, as indicated by arrow 34, forces the intermediate portion 30 against the friction element 24, as indicated by arrow 36, resisted by the curved friction surface 14, as indicated by the opposing arrow 38, thereby generating a frictional resistance to the rotation. At least two springs 26, two friction elements 24, and two cylindrical friction surfaces 14 are preferably provided for redundancy.

The pivot 16 comprises a shaft 40 received whithin a bearing 42. The bearing 42 is mounted to the base 12 and the shaft 40 is fixed to the rotatable member 22. The bearing 42 may be any type of bearing suitable for use in a throttle control pedal including, without limitation, bushings, ball bearings, needle bearings, and roller bearings.

The base 12 may configured in a variety of ways. For example, the base 12 may comprise a bottom panel 11 and two side flanges 13 extending upward from the bottom panel 11. A stop pin 15 may be attached to the base 12 that performs multiple functions. First, the first end 28 of the spring 26 rests against it, thus restraining the first end 28 against rotation. Second, the stop pin 15 acts as an idle stop for the rotatable member 22. As will be described more fully, the stop pin may also be used to provide accurate registration of the rotatable member 22 relative to a with a position sensor with less variation, and it may also be used as a single fastener that assembles the manual control apparatus 10.

The rotatable member 22 may comprise a finger 23 that engages the stop pin 15 at the idle position thus preventing further rotation. The second end 32 may be fixed to the rotatable member 22 by a second pin 17. The friction element 24 may be fixed to the rotatable member 22 by a third pin 19 that allows the friction element to rotate relative to the rotatable member 22. The pin connection causes essentially all of the load 34 induced by the intermediate portion 30 to be transferred to the cylindrical friction surface 14, although this is not strictly necessary in the practice of the invention as long as a substantial portion of the load 34 is transferred. A foot rest 25 may be pivotally mounted to the end of the rotatable member 22, and may be spring biased against the rotatable member 22 if desired. Numerous variations in such minutia are possible and evident in light of the description provided herein.

Figure 3:
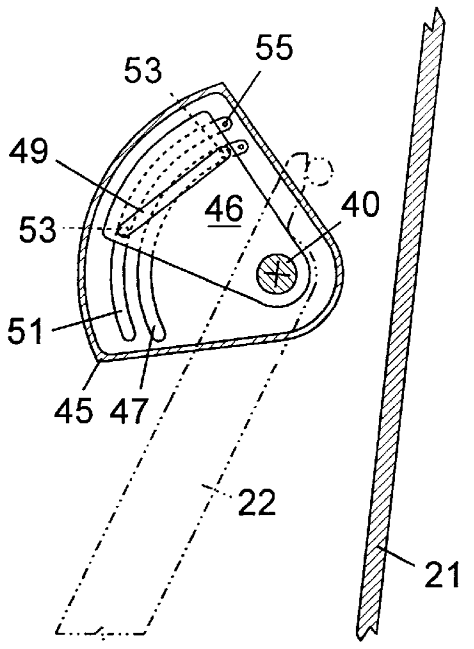
FIG. 3 is a side cross-sectional view of a manual control apparatus according to a further aspect of the invention, taken along line 3—3 of FIG. 4.
Figure 4:
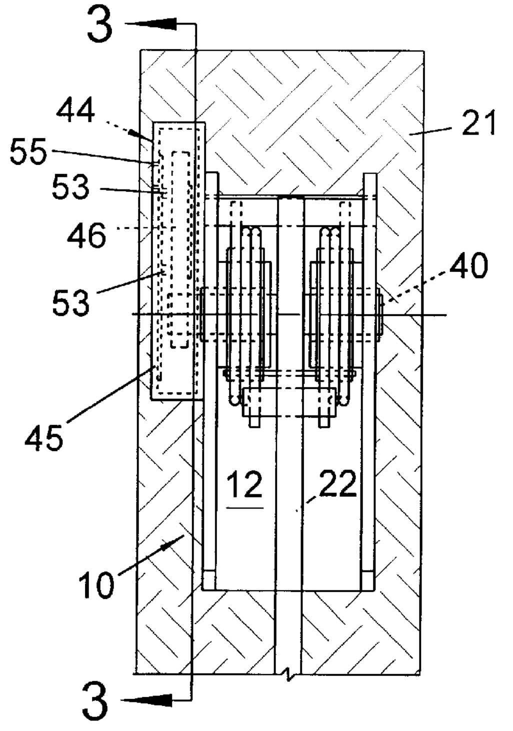
FIG. 4 is a front view of a manual control apparatus according to an aspect of the invention.

Referring now to FIGS. 3 and 4, an angular position sensor 44 may be mounted to the base 12 that senses angular position of the shaft 40. FIG. 4 is a front view of the upper portion of the throttle control pedal 10, and FIG. 3 is a side cross-sectional view taken along line 3—3 of FIG. 4. The various components of the throttle control pedal 10 are the same as presented in FIGS. 1 and 2, and numbering is not repeated here for the sake of clarity, unless needed for reference. Various angular position sensors may be employed in the practice of the invention. In the example presented, the angular position sensor 44 comprises a rotor 46 fixed to the shaft 40. In FIG. 3, the rotatable member 22 is shown in phantom for reference purposes.

In the example presented, the angular position sensor 44 is a simple potentiometer. The position sensor 44 further comprises a housing 45 that encloses the rotor 46, and an opposing pair of conductive paths 47 and 51. The rotor 46 is provided with a pair of spring biased electrical brushes 53 electrically clamped to each other by a shunt 49. The brushes 53 and shunt 49 provide a conductive path in combination with the conductive traces 47 and 51. Rotating the rotatable member 22 rotates the rotor 46 which increases the length of the conductive path, and hence the resistance in proportion to the rotation of the rotatable member 22.

A pair of conductive feed-throughs 55 are provided that may be connected to a wiring harness and appropriate electronics for converting the resistance reading to an indication of angular position. Variations are possible, and numerous suitable position sensors 44 are well known in the art. It is not intended to restrict the invention to the simple potentiometer embodiment presented herein. For example, U.S. Pat. No. 5,133,321 to Hering et al. discloses an integrated position and idle control sensor for drive-by-wire pedal assemblies, which is incorporated herein by reference.

Figure 5:
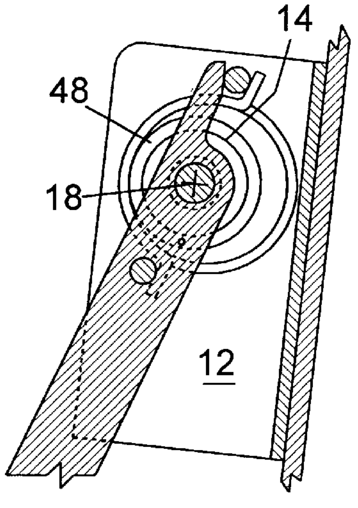
FIG. 5 is a side cross-sectional view of a manual control apparatus according to a further aspect of the invention.

The friction element 24 of FIGS. 1 and 2 is configured as a shoe. It does not encircle the cylindrical friction surface 14. However, the friction element may be configured in other shapes. As presented in FIG. 5, a friction element 48 is presented that is configured as a ring the encircles the curved friction surface 14. Similarly, the curved friction surface 14 may be fully cylindrical about the axis of rotation 18, as shown in FIG. 5, or may be just a sector of a cylinder.

Figure 6:
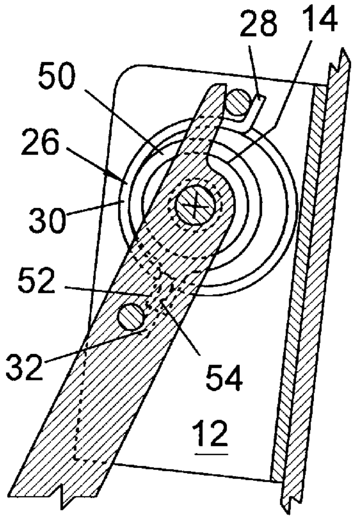
FIG. 6 is a side cross-sectional view of a manual control apparatus according to a further aspect of the invention.

Referring now to FIG. 6, another embodiment is presented that implements a friction element 50, wherein the spring 26 is a torsional spring encircling the axis of rotation 18. The curved friction surface 14 is a cylindrical surface concentric about the axis of rotation 18. The friction element 50 is a ring encircling the curved friction surface 14 and comprises a protuberance 54 having a channel 52 that receives the second end 32 of the spring 26.

Figure 7:
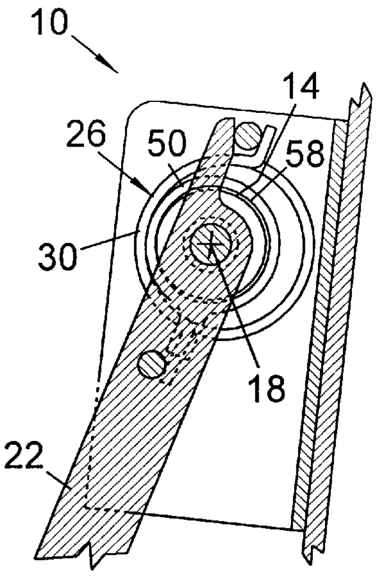
FIG. 7 is a side cross-sectional view of a manual control apparatus according to a further aspect of the invention.

Referring now to FIG. 7, a preferred embodiment is presented that implements the friction element 50, wherein the spring 26 is a torsional spring encircling the friction element 50. The torsional spring is spaced from the friction element 50 except at the intermediate portion 30, wherein the intermediate portion 30 rests upon the friction element 50 supported by the curved friction surface 14. The spring 26 is stressed when the throttle control pedal 10 is assembled such that a preload is exerted upon the friction element 50 at the intermediate portion 30 toward the axis of rotation 18 when the rotatable member 22 is in the idle position, as shown. The spring 26 is eccentrically offset relative to the friction element 50 when installed on the base 12.

The inside diameter of the friction element 50 is larger than the outside diameter of the curved friction surface 14 such that a space 58 is defined therebetween, except that the spring preload deflects the friction element 50 only beneath the intermediate portion 30 of the spring 26 such that it is forced into contact with the curved friction surface 14 beneath the intermediate portion 30. In practice, the inside diameter of the friction element 50 needs to be only slightly larger than the diameter of the curved friction surface such that a frictional resistance to rotation is generated essentially beneath the intermediate portion 30, and not along the entire circumference of the friction surface 14.

This feature, in combination with the spring 26 being spaced from the outside diameter of the friction element 50, except at the intermediate portion 30, generates an essentially pure side load during stroking of the rotatable member 22 directed toward the axis of rotation 18. In such manner, the location where the friction element 50 generates the frictional resistance to rotation and the magnitude of the frictional resistance are precisely controlled.

According to a further aspect of the invention, a method of applying hystersis to a manual control apparatus is provided, comprising forcing an intermediate portion 30 of a spring 26 against a friction element 24 resting on a curved friction surface 14 that is part of a base 12 by rotating a rotatable member 22 about an axis of rotation 18 and rotating a second end 32 of the spring 26 with the pedal lever, a first end 28 of the spring 26 being coupled to the base 12, the rotatable member 22 being mounted to the base 12 and the friction element being directly coupled to the rotatable member 22.

Figure 8:
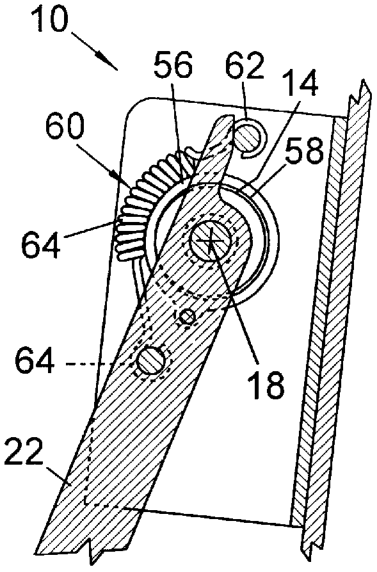
FIG. 8 is a side cross-sectional view of a manual control apparatus according to a further aspect of the invention.

Referring now to FIG. 8, an embodiment is presented identical to FIG. 7, except that the torsional spring 26 is replaced by a linear spring 60 having a first end 62, and intermediate portion 64, and a second end 66. The spring 60 and the intermediate portion 64 function in the same manner previously described in relation to FIG. 7 to provide a side load on the friction element 56, and to resist depression of the rotatable member 22. In this example, friction element 56 comprises a protuberance and pin passing through the protuberance and attached to the rotatable member 22, which directly couples the friction element 56 and the rotatable member 22. Although described with respect to particular embodiments, the concepts described in relation to FIGS. 7 and 8 may be implemented in the other embodiments described herein.

Although described in relation to a rotatable member 22 that is a lever with reference to FIGS. 1–8, any manually rotatable member may be implemented in the practice of the invention with any control apparatus such as a throttle control, a brake control, or other manual control adaptable for use with the invention, without limitation.

Figure 9:
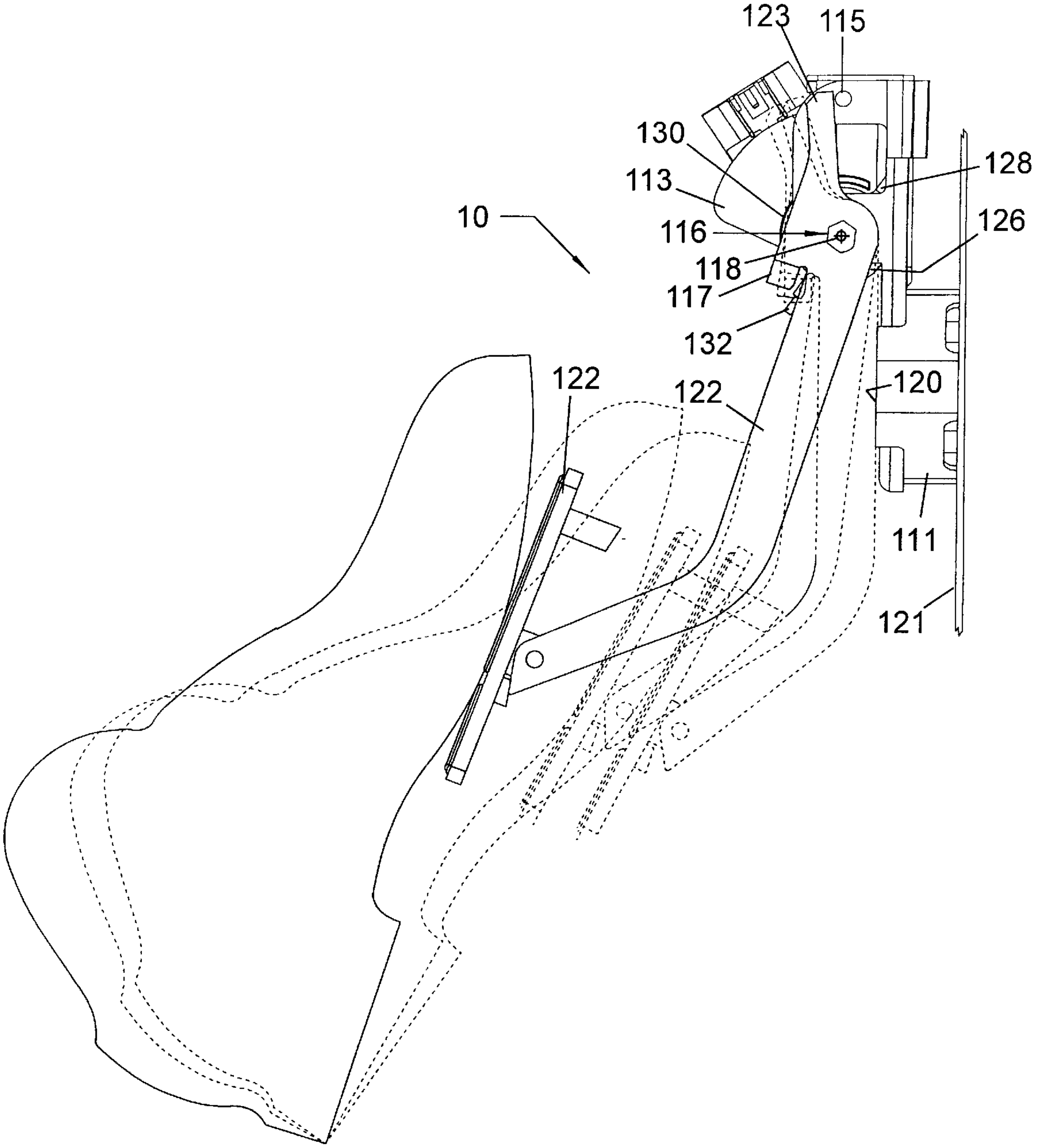
FIG. 9 is a side view of a throttle control pedal according to a further aspect of the invention.
Figure 11:
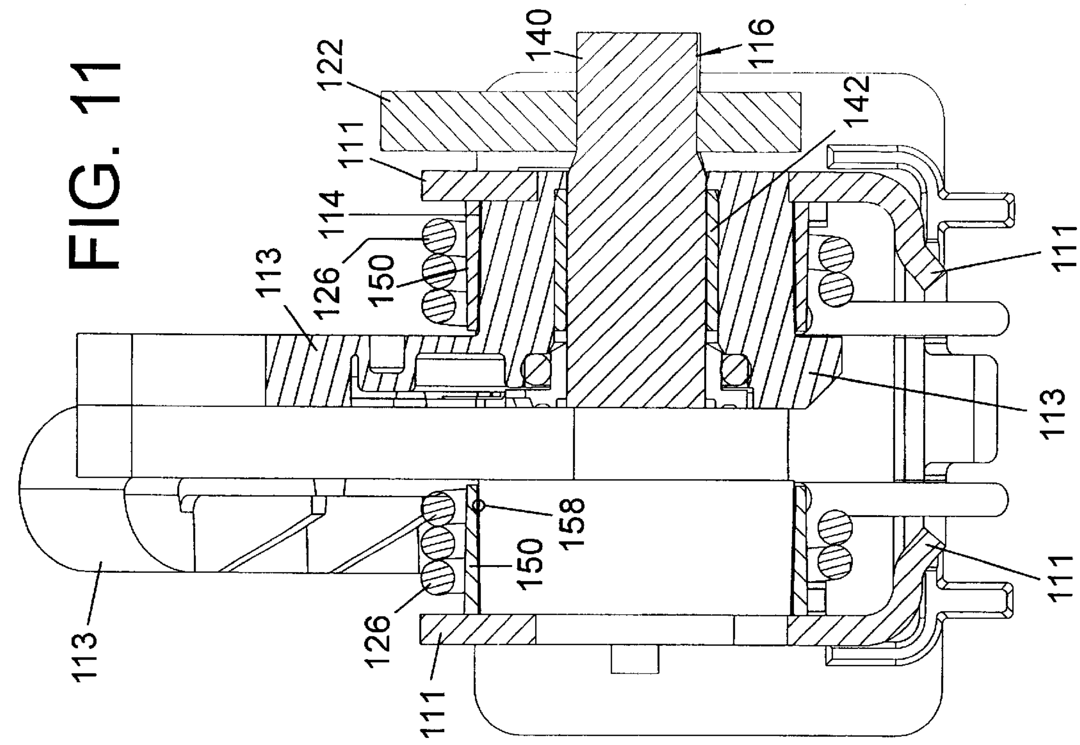
FIG. 11 is an enlarged front view of an upper portion of the FIG. 9 throttle control pedal with partial cross-sections.
Figure 10:
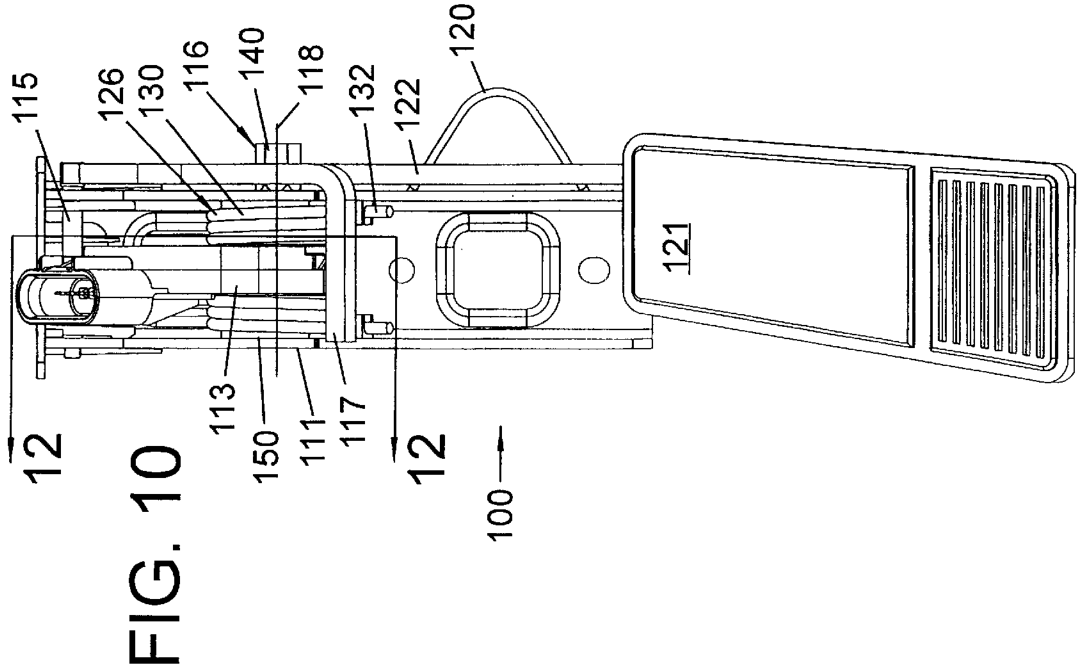
FIG. 10 is a front view of the FIG. 9 throttle control pedal.

Referring now to FIGS. 9 and 10, side and front views, respectively, of a throttle control pedal 100 with hysteresis are presented according to a further aspect of the invention. FIG. 11 presents an enlarged view of the upper portion of FIG. 9 with partial cross-sections of selected portions. The throttle control pedal 100 is shown mounted to a suitable structure of a motorized vehicle, such as a passenger compartment firewall 121.

Referring to FIGS. 9–11, The throttle control pedal 100 comprises a base 112 comprising a frame 111 and a housing 113 The housing 113 has a curved friction surface 114, as shown in FIG. 11. As used herein, the term "base" is intended to mean a non-rotating structure to which the lever is coupled, and any non-rotating structure mounted to the base. Thus, the housing 113 and frame 111 are both members of the base 112.

A pivot 116 is mounted to the base 112 that defines an axis of rotation 118 spaced from the curved friction surface 114. The curved friction surface 114 is cylindrical about the axis of rotation 118, and the pivot 116 comprises a shaft 140 received within a bearing 142 mounted to the housing 113. A lever 122 is fixed to the shaft 140. A foot rest 121 is pivotally attached to the lever 122. A friction ring 150 is mounted to rotate with the lever 122, spaced from the axis of rotation 118, encircling the curved friction surface 114 and forcible against the curved friction surface 114.

A torsional spring 126 encircles the friction ring 150. The torsional spring has a first end 128, a second end 132, and an intermediate portion 130 between the first end 128 and the second end 132. The first end 128 is fixed to the base 112 and the second end 132 is fixed to the lever 122. Rotation of the lever 122 forces the intermediate portion 130 against the friction ring 150 resisted by the curved friction surface 114 thereby generating a frictional resistance to the rotation through the friction ring 150. Thus, the principle of operation of throttle control pedal 100 is identical to that of the throttle control pedal 10 of FIGS. 1 and 2.

As previously described in relation to FIG. 7, a small space 158 is defined between the friction ring 150 and the curved friction surface 114, except beneath the intermediate portion 130 of the spring 126 where the friction ring 150 rests upon the curved friction surface 114 due to preload in the spring 126.

A stop pin 115 is mounted to the base 112 and the lever 122 is provided with a finger 123 that engages the stop pin 115 in the idle position. The lever 122 also comprises a cross bar 117 that engages the second end 132 of the spring 126. The base 12 also comprises a lower stop 120 that stops further pivoting of the lever 122 at full depression.

Figure 12:
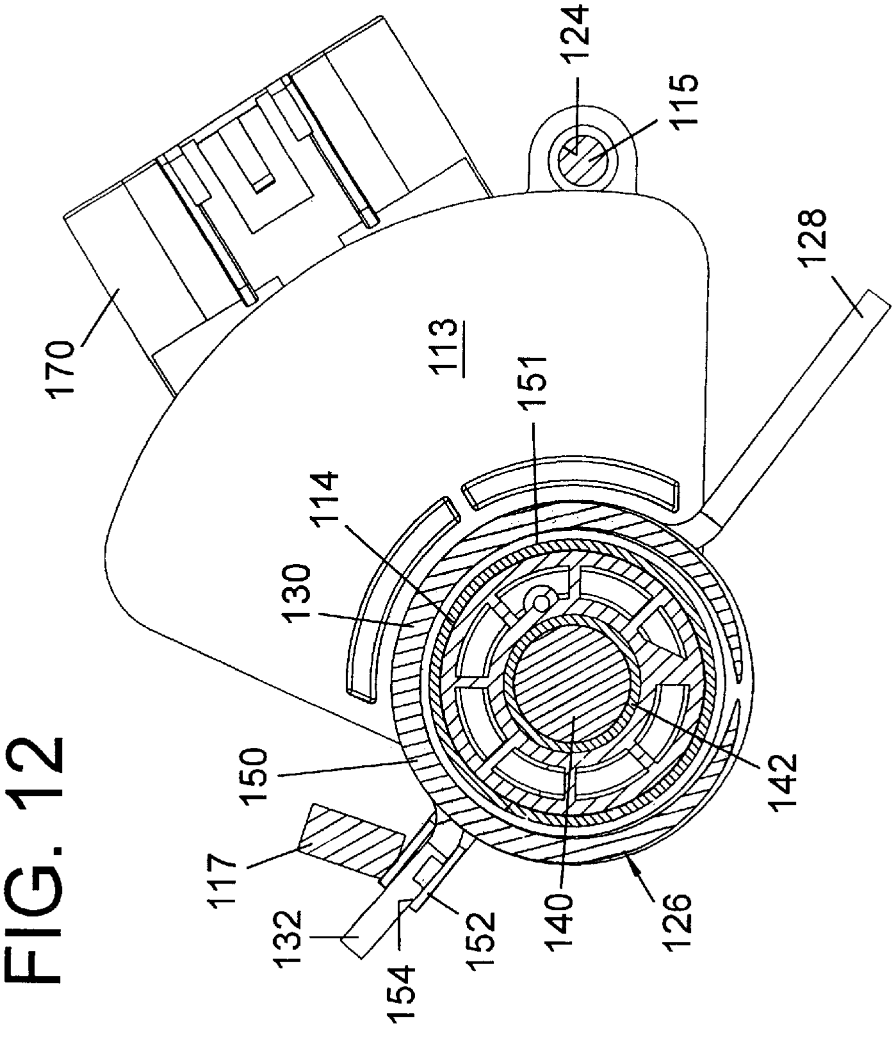
FIG. 12 is an enlarged side view of an upper portion of the FIG. 9 throttle control pedal with partial cross-sections taken along line 12—12 of FIG. 10.

Referring now to FIG. 12, a side cross-sectional view of the upper part of the throttle control pedal 100 through the housing 113 taken along line 12—12 of FIG. 10 is presented. The friction ring 150 comprises an outside cylindrical surface 151 and a protuberance 152 extending therefrom. The protuberance 152 has a channel 154 that receives the second end 132 of spring 126. The cross bar 117 is shown for reference, and preferably rides on the protuberance 152. Preferably, the protuberance 152 and cross bar 117 rotate concentric with the axis of rotation 118 so that the cross bar 117 does not slide on the surface of the protuberance while the lever 122 is depressed.

Figure 13:
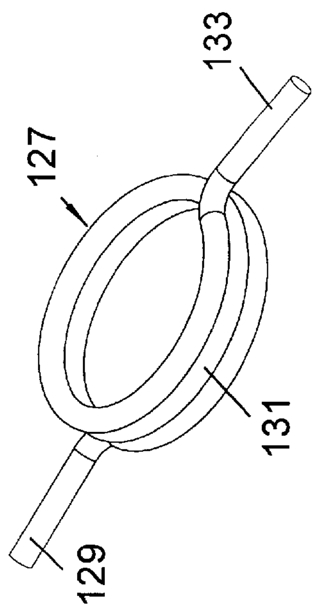
FIG. 13 is a perspective view of a spring according to an aspect of the invention.
Figure 14:
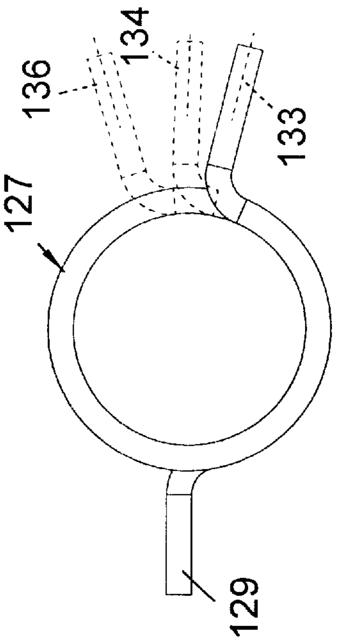
FIG. 14 is a top plan view of the FIG. 13 spring.

Referring now to FIG. 13, a perspective view of a spring 127 that may be used in the practice of the invention is presented. Spring 127 comprises a first end 129, an intermediate portion 131, and a second end 133, and is identical to spring 126 except the first end 129 is shorter than the first end 128 of spring 126. Such variations may be made for particular applications without departing from the invention. Referring now to FIG. 13, a top plan view of the spring 127 is presented in an unstressed state. The spring 127 is preloaded when installed with the pedal 122 in the idle position, as indicated by the phantom position 134 of the second spring end 133. Full load is indicated by phantom position 136 of the second spring end 133.

Figure 15:
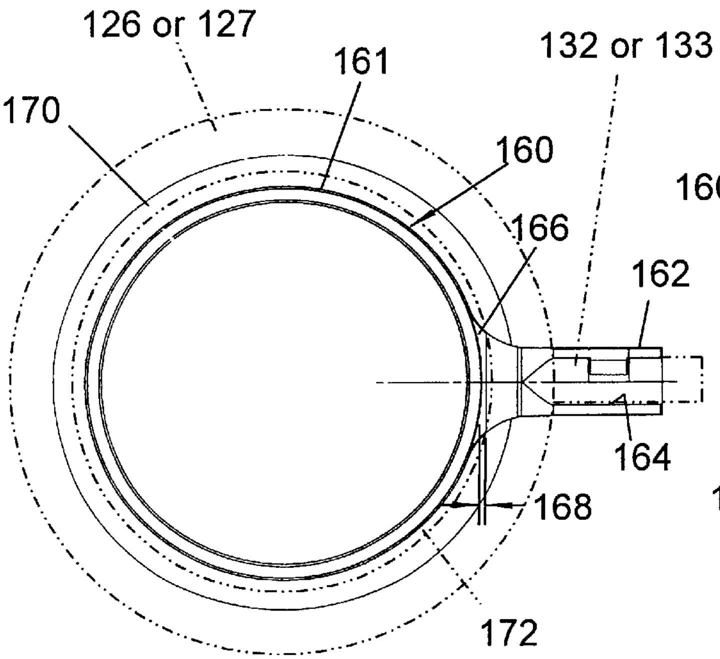
FIG. 15 is a top plan view of friction element according to an aspect of the invention.
Figure 16:
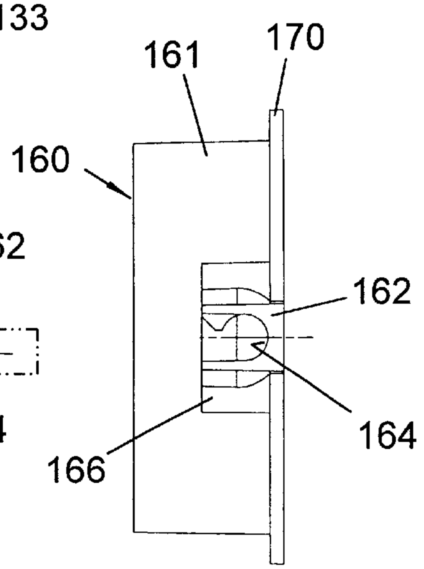
FIG. 16 is a side elevational view of the FIG. 15 friction element.
Figure 17:
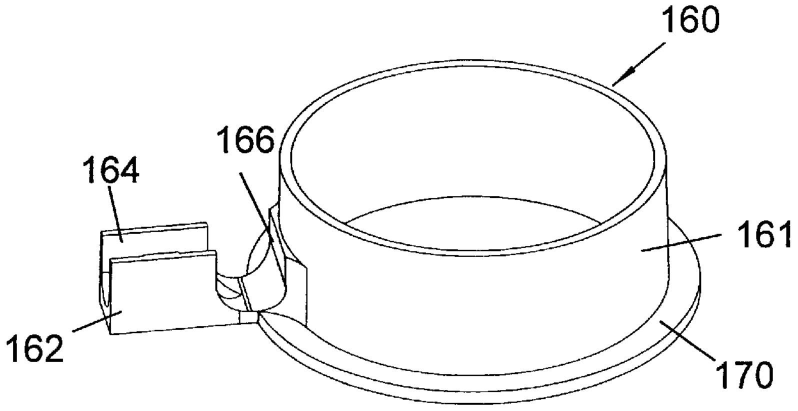
FIG. 17 is a perspective view of the FIG. 15 friction element.

Referring now to FIGS. 15, 16 and 17, a top plan view, a side elevational view, and a perspective view, respectively, are presented of a friction element 160 configured as a ring according to a further aspect of the invention. The friction element 160 comprises an outside surface 161, and a protuberance 162 extending from the outside cylindrical surface 161 having a channel 164 that receives a spring end, as previously described herein. According to a further aspect of the invention, the outside cylindrical surface 161 comprises a spacer 166 having a predetermined thickness 168 above the surface 161, and the protuberance 162 extends from the spacer 166. The protuberance 162 and the spacer 166 couple the torsional spring 126 or 127 (shown in phantom) relative to the friction ring or element 160 such that in an unstressed state a space is defined between the torsional spring and the friction ring encircling the friction ring and interrupted by the spacer. The second end 132 or 133 (shown in phantom) is received within the channel 164. The friction element 160 may also comprise a rim 170 extending outwardly from the outside cylindrical surface 161. Upon installing the friction element 160 and spring assembly into a pedal assembly 10 at an idle position, preloads the spring, and causes the intermediate portion of the spring to be forced into contact with the friction ring 160, as previously described, thus interrupting the space 172 at another location.

Figures 18, 19:
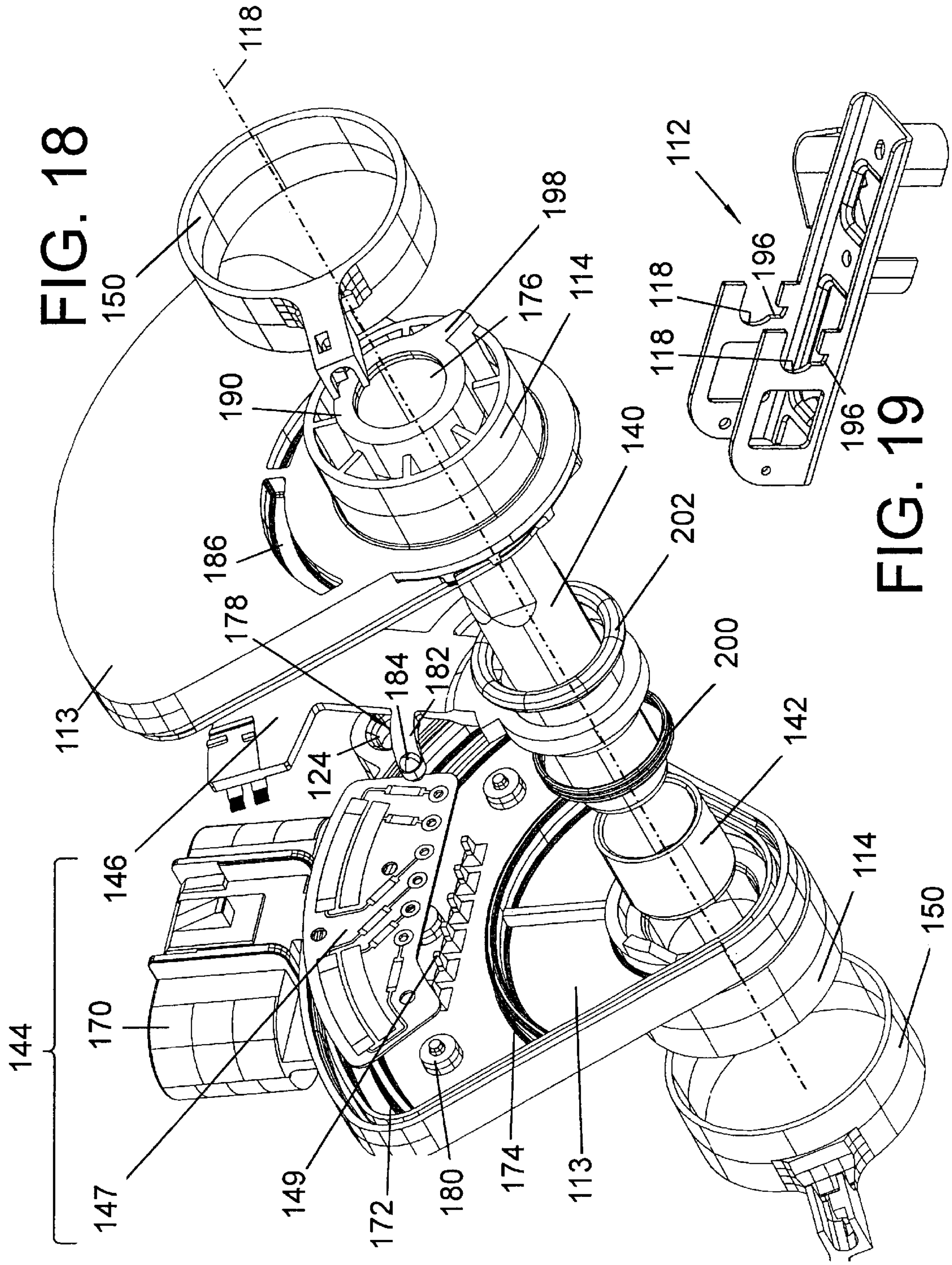
FIG. 18 is an exploded perspective view of a housing according to an aspect of the invention.
FIG. 19 is a perspective view of a base that is employed with the housing of FIG. 18.

Referring now to FIG. 18, an exploded perspective view of the housing 113 is presented, along with components attached to the housing 113. The housing 113 includes an angular position sensor 144 that is coupled to the pivot to sense rotation thereof. In the example presented, the angular position sensor comprises a rotor 146 coupled to the shaft 140, and a sensing element 147 fixed to the housing. Terminals 149 are provided that mate with the sensing element, and that are connected to an external electrical connector 170 for connection to a wire harness. An internal spring 200 and an O-ring may 202 may also be provided.

The housing 113 comprises a first abutment 172 that defines a first datum plane perpendicular to the axis of rotation 118 and a second abutment 174 that defines a second datum plane perpendicular to the axis of rotation 118. The pivot shaft is received within an opening 176 in the housing 45. The sensing element 147 cooperates with the rotor 146 to indicate an angular position thereof relative to the base 112.

The sensing element 147 rests upon the first abutment 172 and a rotor spring 178 biases the rotor 146 against the second abutment 174. Thus, the sensing element 147 and the rotor 146 are accurately positioned relative to each other, and the positioning is not dependent accuracy in joining the first and second halves of the housing 113.

In the example presented, the first and second abutments 172 and 174 are curved ridges molded in the left half of the housing 113. One or more further structures may be added, such as a nipple 180 that position the sensing element 147 within the first datum plane. If the axis of rotation 118 is viewed as a Z-axis, then the X and Y axes lie in the first datum plane, as determined by the first abutment 172, and the nipples 180 position the sensing element relative to the X and Y axes. Thus, the sensing element 180 may be accurately positioned in all three spatial dimensions relative to the rotor 146. Innumerable variations are possible in light of the description provided herein.

In the example presented, the rotor spring 178 comprises at least one tab 182 that is integral with the rotor 146. Two opposing tabs 182 are preferably provided. The tab 182 bears against the right half of housing 113 and biases the rotor 146 against the second abutment 174. The tab 182 may be provided with a spherical bump 184 that focuses the spring load onto a predefined area of the housing 113. The housing 113 may also comprise a third abutment, the backside of which indicated at 186, that the rotor spring 178 bears against. In the example presented, the third abutment 186 is a curved ridge and serves as a track upon which the spherical bump 184 rides. Innumerable variations are possible in light of the description provided herein.

Referring now to FIG. 19, a perspective view of the base 112 is provided. According to a further aspect of the invention, the base 112 comprises a pair of recesses 188. The housing 113 comprises a pair of opposing bosses 190 (FIG. 18) that are received within the recesses 188. The stop pin 115 couples the housing to the base thereby retaining the bosses 190 within the recesses 188. The housing 113 is provided with a stop pin hole 124 tht receives the stop pin 115.

Figure 20:
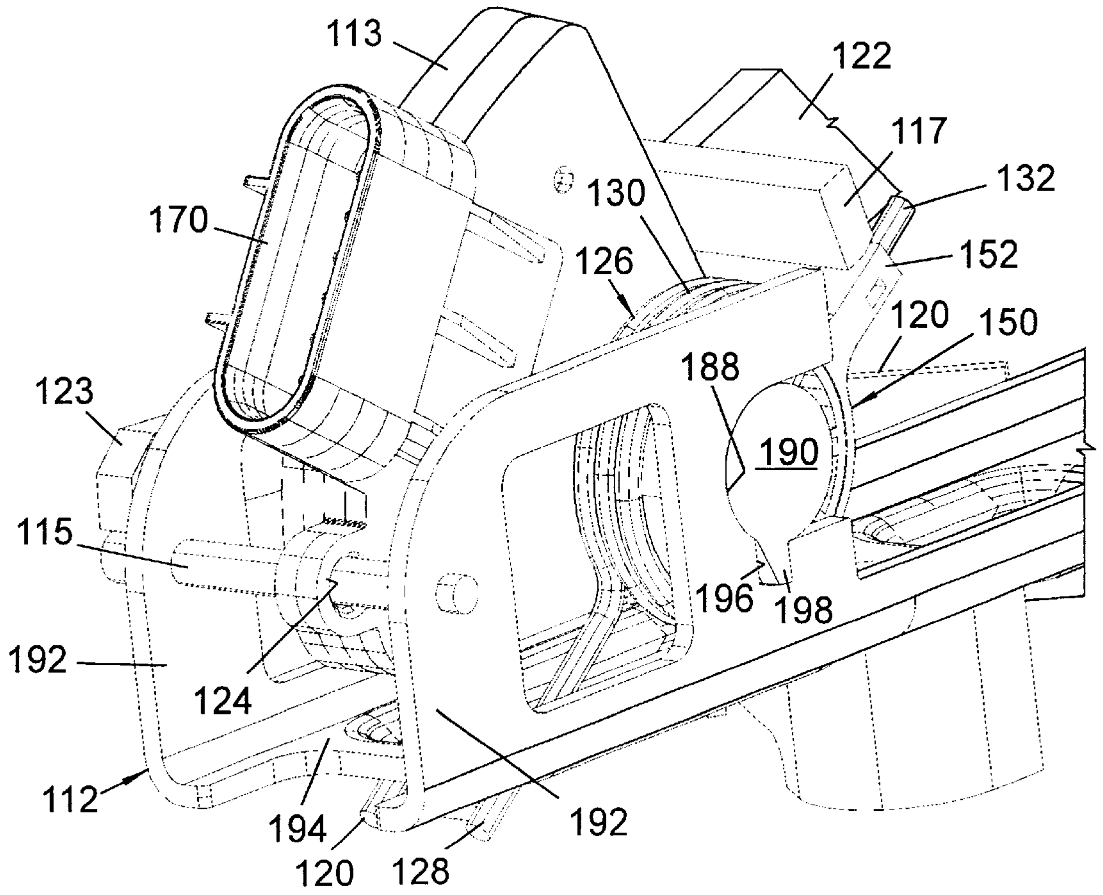
FIG. 20 is a perspective view of the backside of an upper portion of the FIG. 9 throttle control assembly.

This is further illustrated in FIG. 20 wherein a perspective view is presented of the backside of the upper portion of the throttle control pedal 100 of FIG. 9. The bosses 190 closely conform to the recesses 188, which open in the same direction. The stop pin 115 is located on a side opposite from that direction. In the embodiment presented, the recesses 188 are C-shaped and formed in a pair of side flanges 192 that extend upward from a bottom panel 194, and the bosses 190 are cylindrical. The housing 113 is captive in all directions within the bracket 112. The stop pin 115 serves as a single fastener that holds the assembly together.

As presented in FIGS. 18, 19, and 20, the recesses 188 are provided with slots 196, and the bosses 190 are provided with ears 198 that are received within the slots 196. The slots 196 and ears 198 assist in assembly. During assembly, the bosses 190 are slid into the recesses 188 with a rotation that presses the ears 198 into the slots. This movement rotates the stop pin hole 124 toward the bottom panel 196 of the base 112 until it aligns with the stop pin 115, after which the stop pin is inserted into the stop pin hole 124. According to a preferred embodiment, approximately 50% of the force applied to the pedal during depression is resisted by hysteresis, the balance by the springs. The base is formed from metal, cast or stamped, and is covered with a coating having good dry lubricating properties, such as zinc dichromate or epoxy paint. The bearings are self lubricating and are press fit into the housing. Porous metal or plastic bearings impregnated with oil are desirable. The housing may be formed from a reinforced plastic, injected molded, such as a 30% glass filled polyester. The friction elements may be formed from plastic, such as polyacetol or a fluorpolymer, preferably unreinforced by fiber. The rotor may be formed from plastic and is preferably integrally molded onto the shaft. The sensing element is preferably a ceramic resistance element.

Two biasing/hysteresis springs are preferably provided. The hysteresis force is directly generated by the springs, so that if a spring breaks, the spring ceases to generate hysteresis. Thus, the total hysteresis is always proportional to the spring force.

According to a further aspect of the invention, with reference to FIGS. 1–20 and the description provided herein with respect to those figures, a manual control apparatus is provided, comprising:

a base;

a pivot mounted to said base that defines an axis of rotation spaced from said curved friction surface;

a rotatable member coupled to said pivot, wherein said rotatable member is rotatable around said axis of rotation relative to said base;

an angular position sensor comprising a housing fixed to said base and coupled to said pivot to sense rotation thereof;

a stop fixed to said housing; and, a spring coupled to said rotatable member and said base, said spring biasing said rotatable member against said stop.

According to a further aspect of the invention, a manual control apparatus is provided, comprising:

a base comprising a pair of recesses;

a pivot mounted to said base that defines an axis of rotation;

a rotatable member coupled to said pivot, wherein said rotatable member is rotatable around said axis of rotation relative to said base;

an angular position sensor comprising a housing coupled to said pivot to sense rotation thereof, said housing comprising a pair of opposing bosses that are received within said recesses;

a stop coupled to said housing and said base thereby retaining said bosses within said recesses; and, a spring coupled to said rotatable member and said base, said spring biasing said rotatable member against said stop.

According to a further aspect of the invention, a manually operable throttle control is provided, comprising:

a base;

a manually operable control lever for controlling a throttle position;

an electrical sensor for sensing the angular position of said lever and for outputting an electrical signal related to said lever position;

a shaft rotatably mounted on said base and drivingly connecting said lever with said sensor, said sensor and said shaft being relatively rotatable;

a pin securing said sensor on said base and fixing the rotational position of said sensor relative to said shaft and said lever.

Said pin may include a portion forming stop engagable by said lever to limit the rotation of said lever, and said lever includes a surface engagable with said stop portion of said pin.

Said base may include a pair of spaced apart flanges, said sensor may includes a through-hole therein, and said pin passes through said through-hole and is secured to said flanges.

Said pin may include an extension on one end thereof extending outwardly beyond one of said flanges, and said stop portion is defined on said pin extension.

At least one torsion spring may be wrapped around said drive shaft, said spring having a free end engaging pin whereby to restrain said spring against rotation about said drive shaft.

According to a further aspect of the invention, a manually operable throttle control is provided, comprising:

a base;

a manually operable control lever displaceable for controlling a throttle position;

an electrical sensor for sensing the displacement position of said lever and for outputting an electrical signal related to said lever position;

a shaft carried on said base and connecting said lever with said sensor; and, a locating pin carried on said base for locating the rotational position of said sensor relative to said displacement position of said lever.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A manual control apparatus, comprising:

(a) a base;

(b) a pivot mounted to said base that defines an axis of rotation, said pivot comprising a pivot shaft; and (c) an angular position sensor comprising a housing fixed to said base and coupled to said pivot to sense rotation thereof, said housing comprising a first abutment that defines a first datum plane perpendicular to said axis of rotation and a second abutment that defines a second datum plane perpendicular to said axis of rotation, wherein the first and second abutments are integrally molded in the housing, a rotor within said housing fixed to said pivot shaft, said pivot shaft being received within an opening in said housing, a sensing element comprising a surface having electrically conductive paths thereon in sliding electrical contact with the rotor to indicate an angular position thereof relative to said base, said sensing element resting upon said first abutment and said sensing element surface being substantially in a single plane parallel to the first datum plane, and a rotor spring biasing said rotor in sliding contact against said second abutment.

2. The apparatus of claim 1, wherein said housing comprises a third abutment and said rotor spring bears in sliding contact against said third abutment.

3. The apparatus claim 2, wherein said rotor spring comprises at least one tab integral with said rotor that bears against said third abutment.

4. The apparatus of claim 1, wherein said rotor spring is integral with said rotor.

5. The apparatus of claim 1, wherein said sensing element is generally in a plane perpendicular to said axis of rotation.

6. The apparatus of claim 1, wherein said housing further comprises one or more protrusions in contact with the sensing element to support the sensing element in a predetermined position.

7. The apparatus of claim 2, wherein the housing comprises a separable first half and a separable second half wherein said first and second abutments are on said first half.

8. The apparatus of claim 1, wherein the housing further comprises a curved friction surface spaced apart from said pivot.

9. The apparatus of claim 1, wherein the first abutment and second abutment are arcuate and concentric about the axis of rotation.

10. The apparatus of claim 9, wherein the first abutment is a first radial distance from the axis of rotation and the second abutment is a second radial distance from the axis of rotation, said first radial distance being greater than said second radial distance.

11. The apparatus of claim 7, wherein said third abutment is on said second half of the housing.

* * * * *